US010746594B1

(12) United States Patent
Quilligan et al.

(10) Patent No.: US 10,746,594 B1
(45) Date of Patent: Aug. 18, 2020

(54) THERMOPILE BIAS METHOD FOR LOW VOLTAGE INFRARED READOUT INTEGRATED CIRCUITS

(71) Applicant: UNITED STATES OF AMERICA AS REPRESENTED BY THE ADMINISTRATOR OF NASA, Washington, DC (US)

(72) Inventors: Gerard Quilligan, Greenbelt, MD (US); Shahid Aslam, Greenbelt, MD (US); Nicolas Gorius, Washington, DC (US); Daniel Glavin, Greenbelt, MD (US); John Kolasinski, Greenbelt, MD (US); Dat Tran, Washington, DC (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/532,062

(22) Filed: Aug. 5, 2019

(51) Int. Cl.
| G01J 1/42 | (2006.01) |
| G01J 5/12 | (2006.01) |
| G01K 7/02 | (2006.01) |
| G01J 1/30 | (2006.01) |
| H03M 1/18 | (2006.01) |
| G01J 1/20 | (2006.01) |
| G01J 1/16 | (2006.01) |

(52) U.S. Cl.
CPC .. *G01J 1/42* (2013.01); *G01J 1/16* (2013.01); *G01J 1/20* (2013.01); *G01J 1/30* (2013.01); *G01J 5/12* (2013.01); *G01K 7/02* (2013.01); *G01K 7/021* (2013.01); *H03M 1/18* (2013.01); *H03M 1/187* (2013.01)

(58) Field of Classification Search
None
See application file for complete search history.

(56) References Cited

U.S. PATENT DOCUMENTS

| 6,028,309 | A | * | 2/2000 | Parrish | G01J 5/20 250/332 |
| 2008/0208016 | A1 | * | 8/2008 | Hughes | A61B 5/486 600/301 |
| 2017/0245073 | A1 | * | 8/2017 | Agarwal | H03F 3/183 |

* cited by examiner

*Primary Examiner* — Howard Williams
(74) *Attorney, Agent, or Firm* — Christopher O. Edwards; Bryan A. Geurts; Helen M. Galus

(57) ABSTRACT

An apparatus include one or more DACs and a resistor divider are configured to generate a variable bias voltage $V_{BIAS}$ with respect to a CM voltage $V_{CM}$. The CM voltage $V_{CM}$ is applied to a cathode of one or more thermopiles or a negative input of one or more amplifiers to prevent saturation and over range of one or more low voltage readout amplifiers and one or more ADCs.

20 Claims, 6 Drawing Sheets

THERMOPILE BIAS METHOD FOR LOW VOLTAGE INFRARED READOUT INTEGRATED CIRCUITS

STATEMENT OF FEDERAL RIGHTS

The invention described herein was made by employees of the United States Government and may be manufactured and used by or for the Government for Government purposes without the payment of any royalties thereon or therefore.

FIELD

Some embodiments generally pertain to a method and apparatus to increase the measurement sensitivity of a readout system for thermopiles and thermopile arrays. Other embodiments may generally pertain to thermopile readout sensitivity enhancement, and more particularly, to a thermopile bias method for low voltage thermopile sensor readout integrated circuits (ICs).

BACKGROUND

A thermopile sensor is a two terminal composite device that is sensitive to thermal or infrared (IR) energy and is characterized by an anode (positive terminal) and a cathode (negative terminal) terminating multiple thermocouple devices in series. A thermopile sensor typically outputs a diminutive voltage, proportional to the energy of an impinging IR wave, at its anode with respect to the voltage present at the cathode. The thermopile sensor output voltage amplitude typically ranges from nanovolts to a few millivolts depending on the amount of absorbed IR energy, the optical filter (if any), the material the thermocouples are made of, and on how many thermocouples make up the pile.

Low noise, chopper stabilized amplifiers with high gains are often employed to amplify the tiny thermopile voltages before being digitized with an analog-to-digital converter (ADC). The ADC can also have a resolution where its least significant bit (LSB) value is lower than either the signal or the amplified voltage being measured. The readout circuit may select the amplifier gain and ADC resolution in such a way as to optimize power and bandwidth. Regardless of the ADC resolution, some form of buffering is usually required because thermopiles have non-zero output resistance, which can exceed 10 kOhm. High thermopile output resistance generally requires low pass filtering in the gain path up to the ADC in order to reduce the associated Johnson noise of the thermopile.

A problem emerges when one tries to resolve small signal dependent changes or differences in the thermopile output voltage(s) when the nominal or time averaged thermopile voltage already requires high gain to resolve. The small changes or differences in thermopile output voltage(s) between two instants in time due to variations in the detected IR may be orders of magnitude less than the nominal thermopile output voltage, and thus, difficult to visualize without digital signal processing (e.g. averaging, wavelet filtering, etc.).

However, digital signal processing requires more samples to be acquired, adds cost in terms of memory and computation hardware and thus increases the power dissipation of a readout. Thus, an increase in the analog resolution of the measurement by one or more orders of magnitude may reduce the power dissipation, processing time and cost in the overall readout circuit and associated signal processing.

A classic solution to the problem of resolving small analog difference signals is to either increase the gain in the path leading to the ADC and/or increase the resolution of the ADC. However, high gain increases the risk of saturating the outputs of the amplifier chain(s) and/or over-ranging the ADC(s) when some or all of these components reside on a low voltage readout integrated circuit (ROIC). For example, let's assume that the nominal output voltage of a thermopile exposed to a steady stream of equal amplitude IR packets is 1 mV. This would require a gain of 1,000 to amplify it to 1.0V. If a subsequent IR packet impinging on the thermopile generates, for example, a +1 uV output voltage deviation, the thermopile output signal increases by 1 uV to 1.001 mV, and with the same gain of 1,000 results in an amplified signal of 1.001V. If the ADC range/resolution is 2V/12-bits (for example), then the LSB is 488 uV and said +1 uV deviation would be ultimately resolved as a +2 LSB delta. This may not be large enough to discern from the system noise floor without substantial digital signal processing.

A large ADC output deviation count in response to any IR signal change is usually needed, for example, at least 10 LSBs in order for the signal change to be discerned from the noise floor. In the above example, to achieve the required 5X higher resolution for the 1 uV change, a gain of 5,000 would be needed but this would in turn require a single-ended amplifier to try to output a voltage of 5.005V. This would severely saturate the amplifier and ADC in any low voltage CMOS process node.

The problem is particularly acute when there are multiple thermopile "pixels" such as in a linear or rectangular thermopile array in an IR focal plane. The pixel analog output voltages can all be slightly different from one another depending on their position in the array, which is exposed to the IR radiation generating a plurality of tiny voltage differences. The voltage differences may be orders of magnitude less than the average value of the ensemble of the elements. This would influence the measured resolution of the image along or across the array, which would also affect the image quality of an IR focal plane array.

Higher ADC resolution also may be used to increase the sensitivity of the measurement but with higher cost and power dissipation due to the increased complexity of the ADC architecture.

Thus, a method to increase the sensitivity of a readout channel with a reduced risk of over-ranging or saturating the amplifier(s) or ADC(s) could reduce the cost, power dissipation and processing time of low-level analog signals.

Further, a method to increase the sensitivity of a readout channel without increasing the resolution of the digitizer could also reduce the cost, power dissipation and processing time of low-level analog signals.

In particular, a method to increase the sensitivity of a readout channel by applying a singular voltage adjustment to a plurality of thermopile amplifiers could also reduce the cost, power dissipation and processing time of low-level analog signals.

Further, a method to increase the sensitivity of a readout channel in a low voltage sub-micron CMOS process node could increase the number of thermopile sensors that could be discerned with increased resolution.

SUMMARY

Certain embodiments of the present invention may provide solutions to the problems and needs in the art that have not yet been fully identified, appreciated, or solved by current IC technology.

In one embodiment, an apparatus include a digital-to-analog converters (DAC) configured to generate a variable voltage to drive a resistor divider. The apparatus also includes a thermopile comprising an anode and a cathode. The variable voltage is applied to a cathode of the thermopile to prevent saturation and over range of a low voltage readout amplifier, analog-to-digital converter (ADC), or both.

In another embodiment, an apparatus includes include one or more DACs and a resistor divider are configured to generate a variable bias voltage $V_{BIAS}$ with respect to a CM voltage $V_{CM}$. The CM voltage $V_{CM}$ is applied to a cathode of one or more thermopiles or a negative input of one or more amplifiers to prevent saturation and over range of one or more low voltage readout amplifiers and one or more ADCs.

In yet another embodiment, an apparatus includes DAC configured to generate an adjust voltage bias $V_{BIAS}$ to diver a second resistor. The apparatus also includes a thermopile modeled as a voltage source, comprising an anode connecting to a positive input terminal of an amplifier. The amplifier comprising a negative input driven from a junction of a first resistor and a second resistor, together which form a resistor divider.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
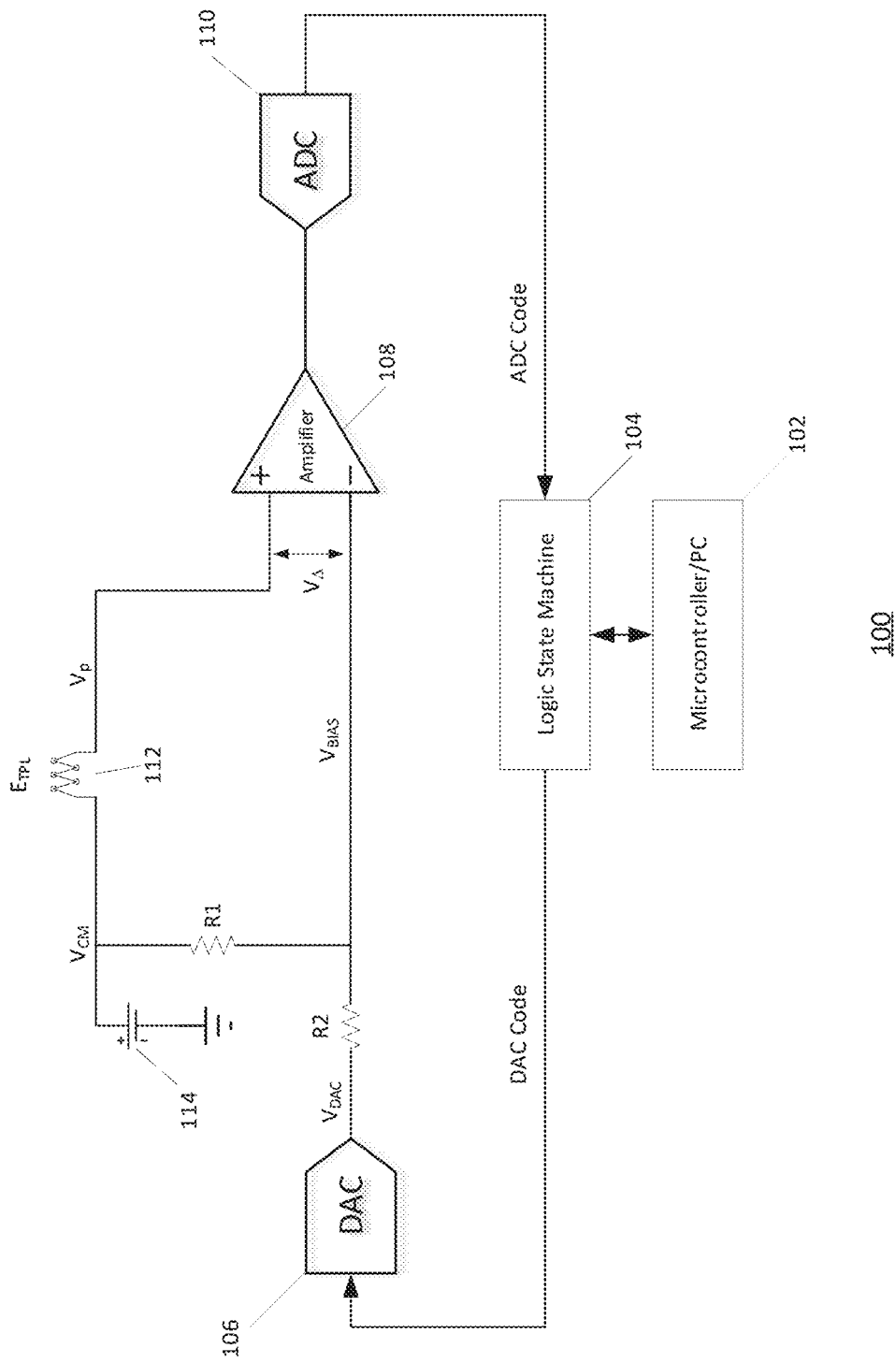
FIG. 1 is a circuit schematic illustrating a readout arrangement with an adjustable bias voltage applied to the negative input terminal of the input amplifier, according to an embodiment of the present invention.

Some embodiments generally pertain to low voltage readout integrated circuits (ROICs) that are used to digitize one or more outputs of thermopile sensors. In one embodiment, a variable voltage is applied to one or more amplifier negative input(s) to prevent the saturation/over range of one or more low voltage readout amplifiers and/or one or more ADCs. This may allow higher gains to be utilized to accurately measure one or more thermopile voltages. In another embodiment, a variable voltage is applied to one or more thermopile cathodes to prevent the saturation/over range of one or more low voltage readout amplifiers and/or one or more ADCs.

In some embodiments, a higher amplifier gain reduces the input referred noise and non-linearity due to ADC quantization errors and transient noise. In one embodiment, a digital-analog converter (DAC) generates a variable voltage to drive a resistor divider. In particular, a DAC may drive a first resistor, connected to a second resistor which together form a resistor divider. The second resistor is directly driven by another voltage source. This other voltage source has a fixed or adjustable value, which may equal zero volts or some non-zero voltage with respect to the amplifier ground reference. In another embodiment, a second DAC may be used to generate the other voltage source connected to the second resistor.

The junction of the first resistor and second resistor provides an adjustable bias voltage ($V_{BIAS}$) for connection to the thermopile cathode or the negative input terminal of the readout amplifier. The higher measurement sensitivity stems from the fact that a properly chosen value for $V_{BIAS}$ may allow a system to discern very small changes in IR impinging on one or more sensors of a thermopile array.

In one embodiment, the optimum $V_{BIAS}$ voltage applied to the negative input of an amplifier is set to approximate the value of the voltage at the thermopile anode with respect to the thermopile cathode. This drives the amplifier differential input closer to zero volts, thus allowing a higher gain to be employed in the amplifier.

In another embodiment, the optimum $V_{BIAS}$ voltage is selected to zero or null the value of the voltage at the thermopile anode with respect to the negative input of the amplifier. This again drives the amplifier differential input closer to zero volts, thus allowing higher gain to be employed in the amplifier.

Some embodiments may employ digital feedback in a two-step procedure to increase the sensitivity of a readout system. For example, one or more DACs and a resistor divider may generate a variable bias voltage ($V_{BIAS}$) with respect to the common mode (CM) voltage ($V_{CM}$). In an embodiment, $V_{CM}$ is applied to one or more thermopile cathode(s) or one or more negative input(s) of an amplifier. Another resistor divider may generate $V_{CM}$, which may itself be buffered by a separate buffer amplifier. In yet another embodiment the $V_{CM}$ is generated by one or more additional DACs.

FIG. 1 is a circuit diagram 100 illustrating a readout arrangement with an adjustable bias generated by DAC 106 driving resistor R2 with a voltage $V_{DAC}$, according to an embodiment of the present invention. In FIG. 1, thermopile 112 is modeled as a voltage source $E_{TPL}$, where the anode of the thermopile connects to a positive input terminal of amplifier 108 and the negative input of amplifier 108 is driven from the junction of resistors R1 and R2. Resistor R1 is driven by voltage $V_{CM}$ from CM source 114. The reason for the resistor divider is to scale DAC's 106 step size seen by the negative input of amplifier 108. This may increase the effective resolution of the DAC 106, over a limited range, supplying $V_{DAC}$ voltage.

DAC 106 may generate the voltage $V_{DAC}$ that is applied to resistor R2. A low output impedance voltage source (or a second digital-analog converter) may generate voltage $V_{CM}$ that is applied to the cathode of the thermopile 112.

In this embodiment, as illustrated in FIG. 1, ADC 110 and adjustment logic, which may be composed of logic state machine/FPGA 104 and/or microcontroller (or computer) 102, controls the settings of DAC 106. A second digital-analog converter may be substituted for the CM voltage source 114.

The adjustment logic may compute the input code ($Code_D$) for the DAC 106 voltage. Assuming very high amplifier 108 input resistances, the approximate Thevenin equivalent resistance seen looking into the junction generating $V_{BIAS}$ is the parallel combination of resistor R1 plus the output resistance of CM source 114 and resistor R2 plus the output impedance of DAC 106. CM voltage source 114 output resistance may be kept quite low when compared to the output resistance of thermopile 112. Since the anode of thermopile 112 is connected to the positive input terminal of amplifier 108, the resulting voltage difference between positive and negative amplifier 108 input terminals may be reduced by a known amount based on the code setting of the DAC (i.e., $Code_D$) 106.

The measurement sequence may be carried out in two "passes". The first pass is a "coarse" measurement. This first pass provides a result to adjust DAC 106 before the second pass. The second pass provides a "fine" result using higher amplifier gain than in the first pass. The coarse and fine results are combined in the proper proportion (taking into account the gains).

Figure 3:
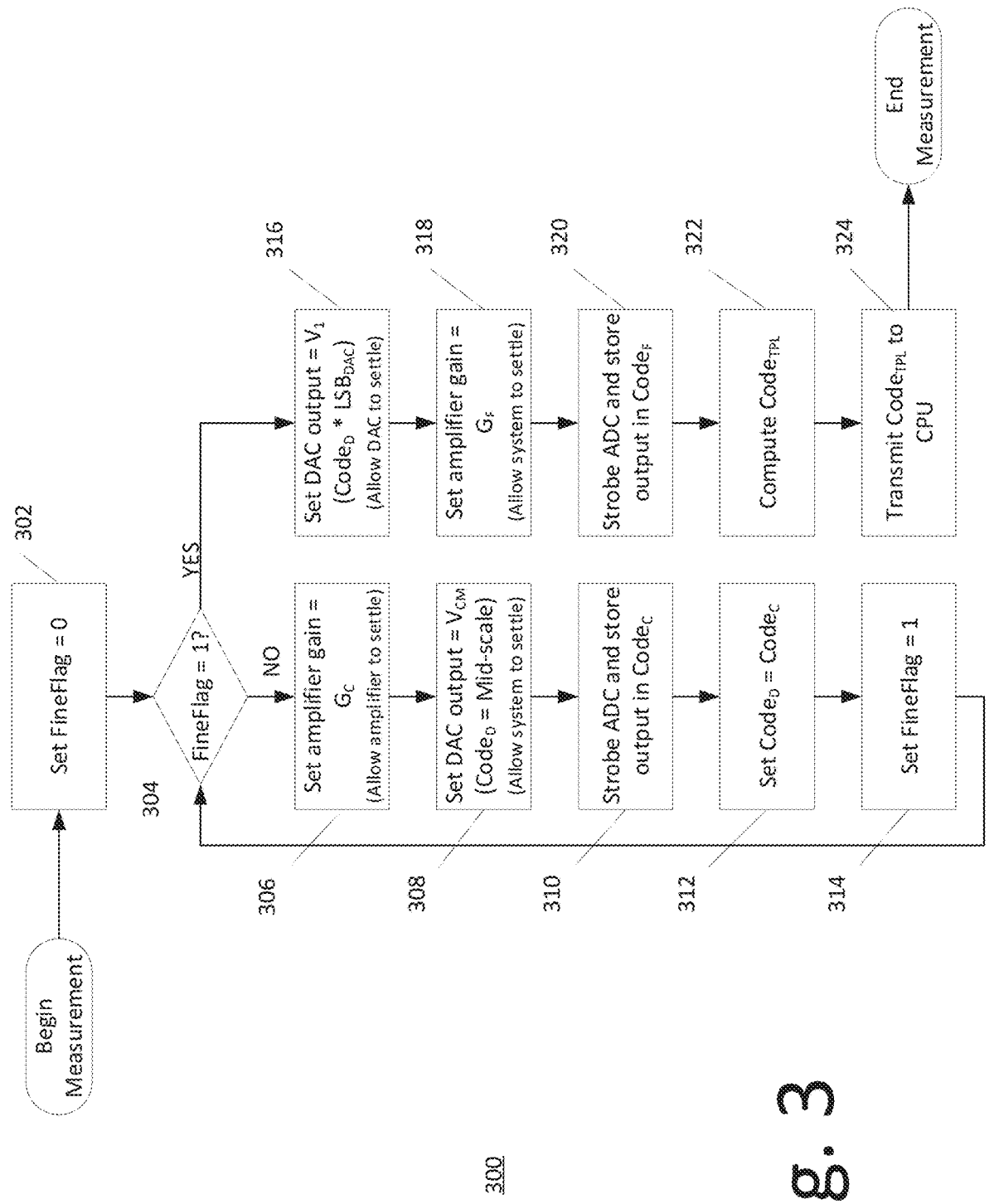
FIG. 3 is a flow chart illustrating a measurement procedure, according to an embodiment of the present invention.

FIG. 3 is a flow chart illustrating a measurement process 300 for one thermopile sensor, according to an embodiment of the present invention. Depending on the embodiment, the steps in measurement process 300 may be implemented with a sequential logic circuit, a field programmable gate array (FPGA), or microcontroller (uC).

In this embodiment, the measurement of a single thermopile output voltage begins at step 302 with setting the FineFlag variable to zero. Next, at step 304, a logic comparison implements a conditional branch depending on the value of FineFlag, and in the first pass of the measurement, the sequence proceeds to step 306 where the first pass gain is set to $G_C$. After allowing the amplifier to settle, the DAC generating the adjustable voltage is set to the CM level which equals $V_{CM}$ at step 308.

Before continuing to step 310, time is allowed for the combination of the DAC and the amplifier outputs to settle to the required first pass accuracy, nominally within ±0.5 ADC LSBs. Then, the ADC is strobed at step 310 to initiate a conversion of its input voltage to a binary code. The binary code in some embodiments represents the approximate amplifier output or $Code_C$. This code is then stored at step 312 in $Code_D$ either unmodified, if it doesn't have to be offset or scaled, or modified. In the latter case, the code may need to be adjusted to account for any difference in the DAC resolution and/or zero and full-scale values compared to the ADC.

At step 314, the FineFlag is set equal to one to indicate that the system is ready for the second pass measurement. The loop returns to the conditional block at step 304 to check the value of FineFlag. Depending on the value of the FineFlag, the process proceeds to the second pass through step 316. At step 316, the DAC voltage is set to the value corresponding to $Code_D$ and the circuit is allowed to settle. Once the circuit settles, the amplifier gain is set to $G_F$ at step 318. After the amplifier has settled to ±0.5 LSB, at step 320 the ADC is strobed and the code corresponding to the ADC input voltage is produced as $Code_F$.

Having determined $Code_C$ and $Code_F$, at step 322, the value of the thermopile voltage in effective LSBs can be calculated from equation (3) or equation (8). This may depend, however, on whether $V_{BIAS}$ is applied to the amplifier negative input or the thermopile cathode. The effective LSB value is equal to the ADC LSB divided by the gain in the second pass ($G_F$). At 324, the $Code_{TPL}$ which was calculated in the previous step is transmitted to the central processing unit (CPU).

Returning to FIG. 1, a first pass measurement is made with both $V_{DAC}$ and $V_{CM}$ set to equal values and the gain of amplifier 108 is set to a starting value ($G_C$). This starting value is lower than the final or second pass value ($G_F$). Then, in the second pass, the result of the first measurement is applied to DAC 106, regenerating $V_{DAC}$. $V_{DAC}$ may reduce the difference between the input terminals of amplifier 108 followed by setting the amplifier 108 to higher gain ($G_F$) and carrying out a measurement after the circuit has had time to settle. The estimated $E_{TPL}$ voltage may then be computed from the first and second ADC measurements and the knowledge of $V_{DAC}$, $V_{CM}$ and the gains $G_C$, $G_F$.

For the embodiment where $V_{BIAS}$ drives the negative input of amplifier 108, the second pass DAC code is generated per the following equation:

$$Code_D = \frac{2^{N_{DAC}}}{2} + \text{Round}\left[\frac{Code_C}{G_C} \cdot \frac{LSB_{ADC}}{LSB_{DAC}} \cdot \left(1 + \frac{R_1}{R_2}\right)\right] \quad (1)$$

where $N_{DAC}$ is the DAC resolution in bits, $Code_C$ is the ADC code from the first pass conversion, $G_C$ is the first pass gain, $LSB_{DAC}$ is the DAC least significant bit value, $LSB_{ADC}$ is the ADC least significant bit value, and $R_1$ and $R_2$ are the resistor divider values. Equation (1) uses the "Round" function, which computes the nearest integer for the value in the brackets. $Code_C$ is computed per the following equation:

$$Code_C = \text{Round}\left(\frac{G_C \cdot E_{TPL}}{LSB_{ADC}}\right) \quad (2)$$

where $E_{TPL}$=the thermopile voltage. Note that $V_{DAC}$=$V_{CM}$ in the first pass. Note also that the maximum value of $Code_C$ is limited to the number of ADC quanta less one, defined by the resolution of the ADC, and the maximum value of $Code_D$ is limited to the number of DAC quanta less one, defined by the resolution of the DAC.

The $V_{CM}$ voltage may set the input common mode voltage applied to the amplifier 108. Further, $V_{CM}$ may be set to equal one half of the difference between the positive and negative power supply voltages plus the negative supply voltage. Setting $V_{CM}$ in this way often maximizes the input common mode range of amplifier 108. The output of DAC 106 along with $V_{CM}$, R1, and R2 sets $V_{BIAS}$ to be at a predetermined value. $V_{BIAS}$ can be chosen to reduce the difference between the positive and negative input terminals of amplifier 108. $V_{CM}$ does not necessarily have to be set at the mid-range point of the nominal amplifier input common mode range and may be adjusted away from that setting. The reason for this could be that the input common mode of amplifier 108 is not perfectly in the middle of the power supply range. This may be due to the specifics of the amplifier design, the temperature or age of the devices, the variations in semiconductor processing or the accumulation of ionizing dose from natural or man-made sources. This fact is incidental to the operation of circuit 100 so long as the voltages at the input terminals of amplifier 108 do not go out of the range of the amplifier input circuit. Thus, a higher amplifier gain can be used to increase the sensitivity of the measurement without the risk of over-ranging or saturating a low voltage amplifier and/or ADC 110.

In certain embodiments, DAC 106 positions the thermopile signal to be within the input ranges of amplifier 108 and ADC 110 at a much higher gain than could otherwise be employed. Thus, the realized accuracy is either specific to the nominal voltage in the case of a single thermopile or to the individual values of a plurality of thermopiles as in an array.

In embodiments where relative accuracy is a system requirement, then DAC 106 and the resistive divider comprised of R1 and R2 may have a combined linearity equal to at least one bit higher than the relative accuracy requirement of the measurement. In an alternative embodiment, for absolute accuracy, then DAC 106, the resistive divider comprised of R1 and R2 and the CM source 114 may have a combined absolute accuracy equal to at least one bit higher than the absolute accuracy requirement of the measurement. Shown below are additional equations needed to estimate the thermopile 112 voltage ($E_{TPL}$) using an adjustable bias applied to the negative input of the amplifier 108. Equations (3) and (4) define the measurement transfer function (in effective LSBs) versus the thermopile input voltage ($E_{TPL}$), where $V_{DAC}$ is the adjustable voltage applied to resistor $R_2$, $V_{CM}$ is the input common mode voltage applied to $R_1$, $LSB_{ADC}$ is the least significant bit value of the ADC, $LSB_{DAC}$ is the least significant bit value of the DAC, $G_F$ is the gain in the second pass of the measurement, $Code_D$ is the DAC code that was derived in the first pass of the measurement and $Code_F$ is the code obtained from the ADC in the second pass of the measurement.

$$Code_{TPL} = \text{Round}\left[G_F \times \left(\frac{Code_D \cdot R_1 + \frac{V_{CM} \cdot R_2}{LSB_{DAC}}}{(R_1 + R_2) \cdot \frac{LSB_{ADC}}{LSB_{DAC}}} - \frac{V_{CM}}{LSB_{ADC}}\right) + Code_F\right] \quad (3)$$

where $$Code_F = \text{Round}\left[\frac{G_F \cdot \left(E_{TPL} + V_{CM} - \frac{V_{CM} \cdot R_2}{R_1 + R_2} - \frac{V_{DAC} \cdot R_1}{R_1 + R_2}\right)}{LSB_{ADC}}\right] \quad (4)$$

and $$V_{DAC} = Code_D \cdot LSB_{DAC} \quad (5)$$

Equations (1) to (5) can be used to provide an estimate of the thermopile voltage by multiplying $Code_{TPL}$ by the effective LSB in the second pass of the measurement. The effective LSB in the second pass of the measurement is given by equation (6).

$$LSB_{EFF} = \frac{LSB_{ADC}}{G_F} \quad (6)$$

Figure 4:
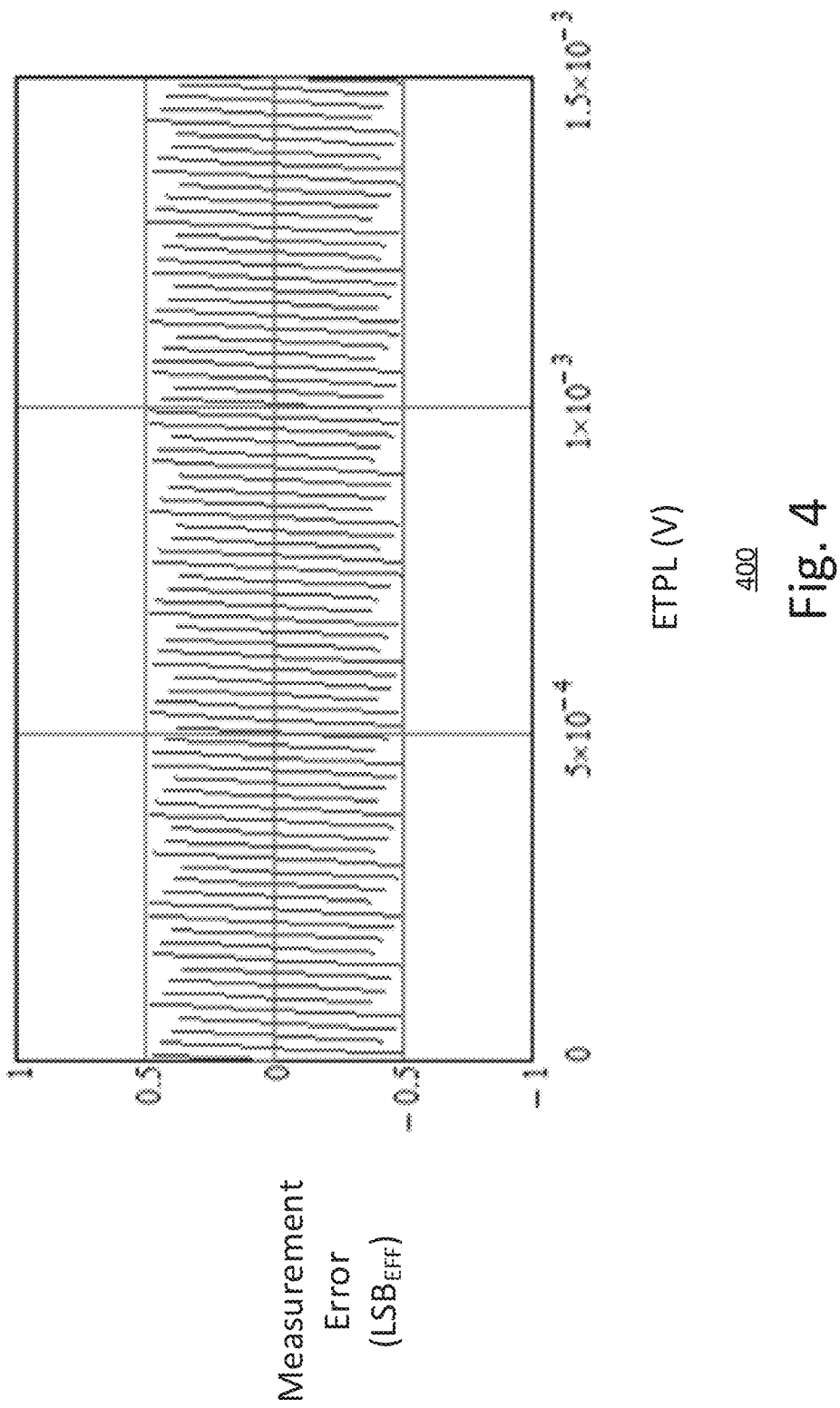
FIG. 4 is a graph illustrating error in the measurement plotted as the difference (or residue) between the input thermopile voltage and the estimated thermopile voltage, according to an embodiment of the present invention.

FIG. 4 is a graph 400 illustrating the error in the measurement plotted as the difference (or residue) in units of $LSB_{EFF}$ between the input thermopile voltage and the estimated thermopile voltage, according to an embodiment of the present invention.

Figure 2:
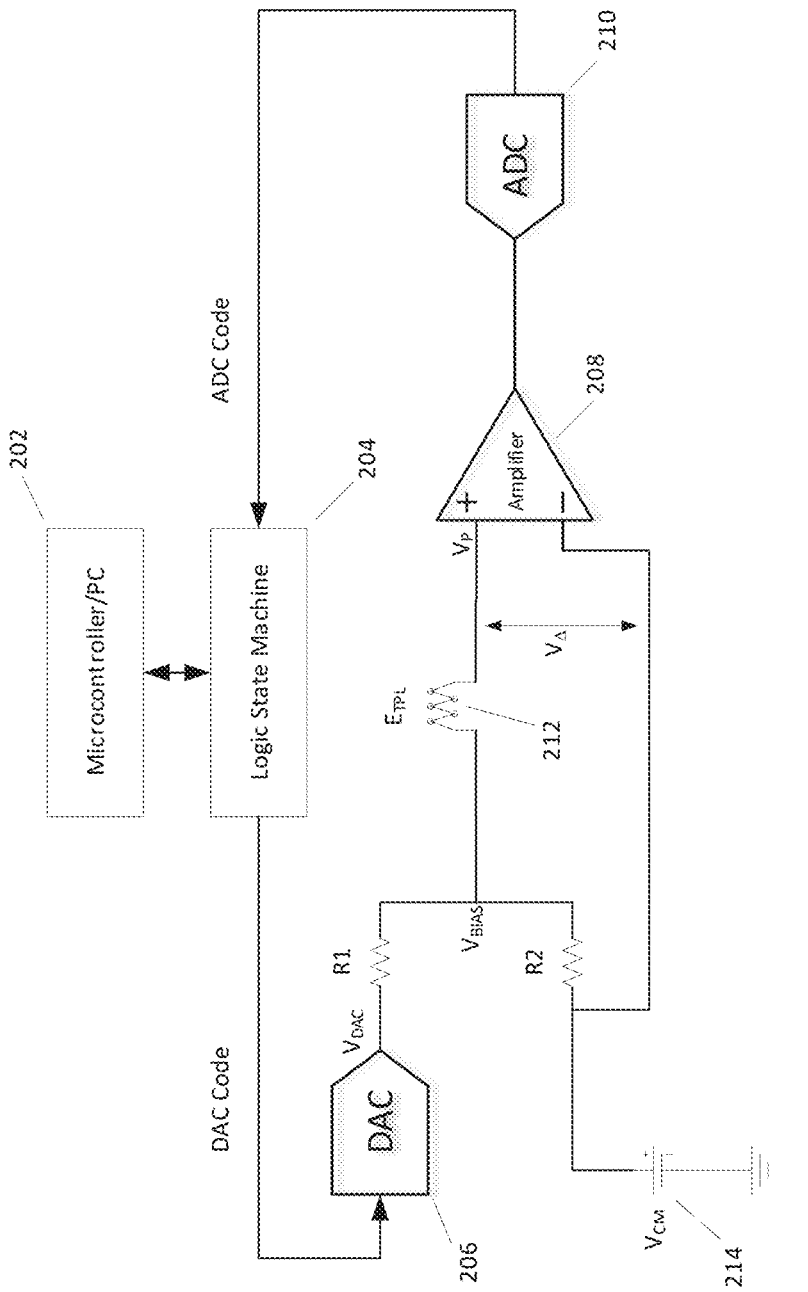
FIG. 2 is a circuit schematic illustrating a readout arrangement with an adjustable bias voltage applied to the thermopile cathode according to an embodiment of the present invention.

In some embodiments, such as that shown in FIG. 2, $V_{BIAS}$ voltage is applied to the cathode of thermopile 212. FIG. 2 is a circuit diagram 200 illustrating a readout arrangement with an adjustable bias generated by DAC 206 driving resistor R1 with a voltage $V_{DAC}$, according to an embodiment of the present invention. In FIG. 2, the thermopile 212 is modeled as a voltage source $E_{TPL}$, where the anode of thermopile 212 connects to a positive input terminal of amplifier 208 and the negative input of amplifier 208 is driven from CM voltage source 214. Resistor R2 is also driven by CM voltage source 214. The reason for the resistor divider is to scale DAC's 206 step size seen by the cathode of thermopile 212. This increases the effective resolution of the DAC 206, over a limited range, supplying the $V_{DAC}$ voltage.

A low output impedance voltage source (or a second digital-analog converter) may generate voltage $V_{CM}$. Voltage $V_{CM}$ in some embodiments is applied to the negative input of amplifier 208 and R2.

In this embodiment, as illustrated in FIG. 2, ADC 210 and adjustment logic, which may be composed of logic state machine/FPGA 204 and/or microcontroller (or computer) 202, controls the settings of DAC 206. An optional second digital-analog converter may be substituted for the CM voltage source 214.

The adjustment logic may compute input code $Code_D$ for the DAC 206 voltage. Assuming very high amplifier 208 input resistances, the approximate Thevenin equivalent resistance seen looking into the junction $V_{BIAS}$ is the parallel combination of resistor R2 plus the output resistance of the CM source 214 and resistor R1 plus the output resistance of DAC 206. DAC 206 output resistance may be kept quite low when compared to the output resistance of thermopile 212. Since the anode of thermopile 212 is connected to the positive input terminal of amplifier 208, the resulting voltage difference between positive and negative input terminals of amplifier 208 may be reduced by a known amount based on the code setting of the DAC (i.e. $Code_D$).

In embodiments where $V_{BIAS}$ drives the cathode of thermopile 212, the second pass DAC code is generated per the following equation:

$$Code_D = \frac{2^{N_{DAC}}}{2} - \text{Round}\left[\frac{Code_C}{G_C} \cdot \frac{LSB_{ADC}}{LSB_{DAC}} \cdot \left(1 + \frac{R_1}{R_2}\right)\right] \quad (7)$$

where $N_{DAC}$ is the DAC resolution in bits, $Code_C$ (see Eqn. 2) is the ADC code from the first pass conversion, $G_C$ is the first pass gain, $LSB_{DAC}$ is the DAC least significant bit value, $LSB_{ADC}$ is the ADC least significant bit value, and $R_1$ and $R_2$ are the resistor divider values. Equation (7) uses the "Round" function, which computes the nearest integer for the value in the brackets. As before, the measurement sequence may be a two-step process as illustrated in FIG. 3.

The equations to compute the thermopile voltage in effective LSBs with the thermopile cathode driven by $V_{BIAS}$ are given in (8) and (9) with $Code_D$ defined in (7).

$$Code_{TPL} = \text{Round}\left[G_F \times \left(\frac{-Code_D \cdot R_2 - \frac{V_{CM} \cdot R_1}{LSB_{DAC}}}{(R_1+R_2) \cdot \frac{LSB_{ADC}}{LSB_{DAC}}} + \frac{V_{CM}}{LSB_{ADC}}\right) + Code_F\right] \quad (8)$$

where $$Code_F = \text{Round}\left(\frac{G_F \cdot \left(E_{TPL} - V_{CM} + \frac{V_{CM} \cdot R_1}{R_1+R_2} + \frac{V_{DAC} \cdot R_2}{R_1+R_2}\right)}{LSB_{ADC}}\right) \quad (9)$$

Some embodiments include an adjustable bias voltage configured to increase the sensitivity of a thermopile readout built in a low voltage CMOS chip process. The adjustable bias voltage may reduce the difference at the inputs of the amplifier to allow additional gain to be applied in the amplifier. An increase in amplifier gain may reduce the input referred errors due to the ADC quantization errors, differential and integral non-linearity and switching transients.

Figure 5:
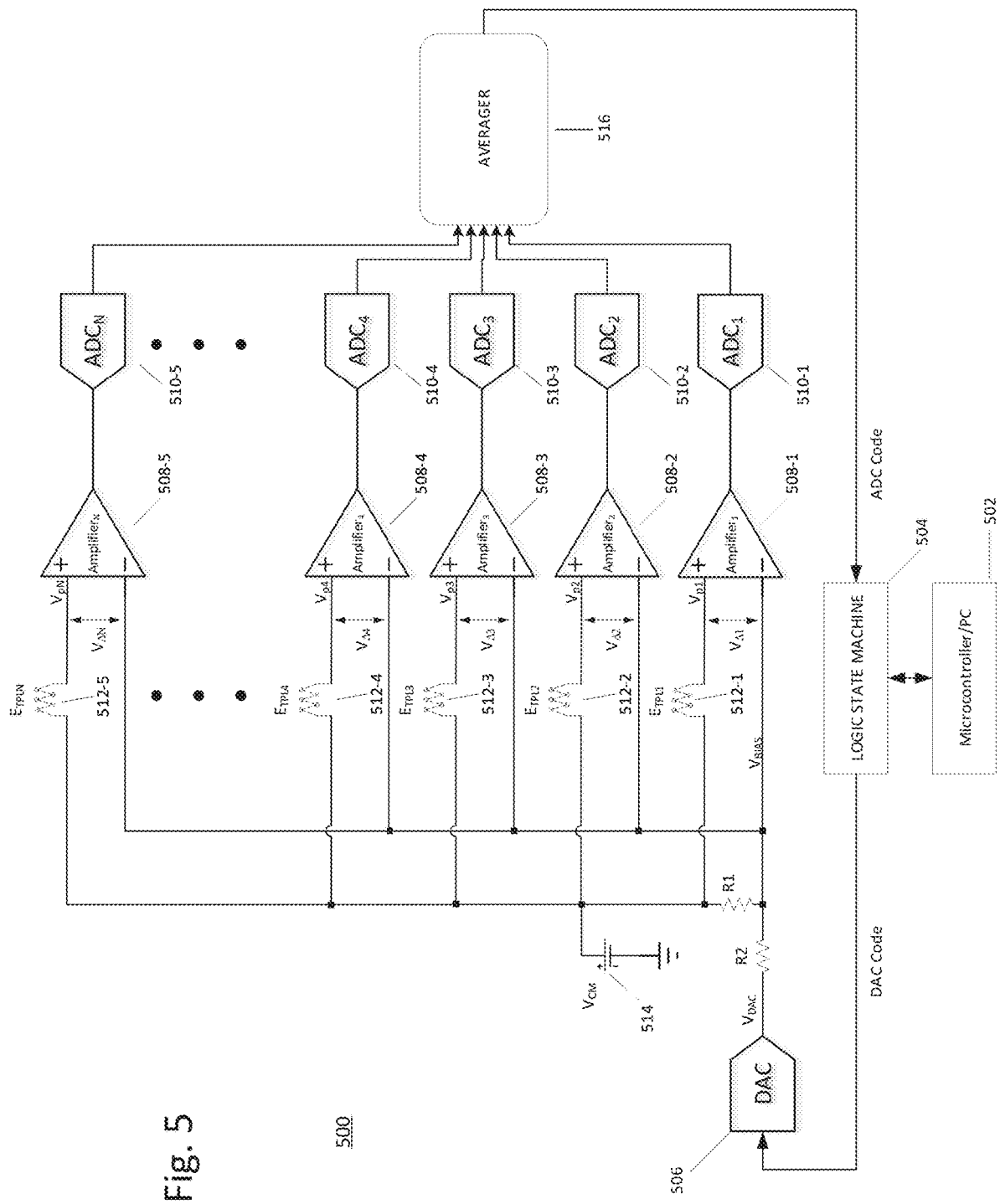
FIG. 5 is a circuit schematic illustrating a readout arrangement with an adjustable bias voltage applied to the negative inputs of a plurality of amplifiers/ADCs digitizing the outputs of a plurality of thermopiles according to an embodiment of the present invention.

In another exemplary embodiment, such as that shown in FIG. 5, there are a plurality of thermopile sensors 512-1 ... 512-5, amplifiers 508-1 to 508-5 and ADCs 510-1 to 510-5. There may also be one resistive divider driven by DAC 506 and CM source 514, both of which combine to generate $V_{BIAS}$ for negative inputs of amplifiers 508-1 to 508-5. This may increase the sensitivity of all of the measurement channels. In this case, the important metric may be the differences between neighboring thermopile outputs or between any thermopile output and the average of the ensemble of thermopile outputs. The outputs of all of ADCs 510-1 to 510-5 are digitally averaged by averager 516 to generate a code for DAC 506. DAC 506 may derive from the ensemble average output code of ADCs 510-1 to 510-5 in the first pass of the measurement sequence. After DAC 506 has settled in the second pass, the gains of amplifier 510-1 to 510-5 are set to $G_F$. After outputs of amplifier 510-1 to 510-5 have settled, the second pass measurement is made with ADCs 510-1 to 510-5 and their respective thermopile output measurements are sent to the user.

Furthermore, in the embodiment shown in FIG. 5, the readout channels each comprise amplifiers 508, ADC 510. It should be appreciated that the apparatuses described herein may be implemented in a low voltage sub-micron CMOS ASIC, which digitizes the outputs of a focal plane array (FPA). Low voltage ASICs are perfectly suited to this application as the thermopile sensor outputs are inherently low voltage and can be applied directly to the ASIC without attenuation. The low supply voltage (<=1.8V) generally results in low power dissipation in a highly compact multi-channel configuration.

It should be appreciated that logic state machine 504 and microcontroller/PC 502 may have similar functions to the logic state machine and microcontroller/PC described in FIGS. 1 and/or 2.

Figure 6:
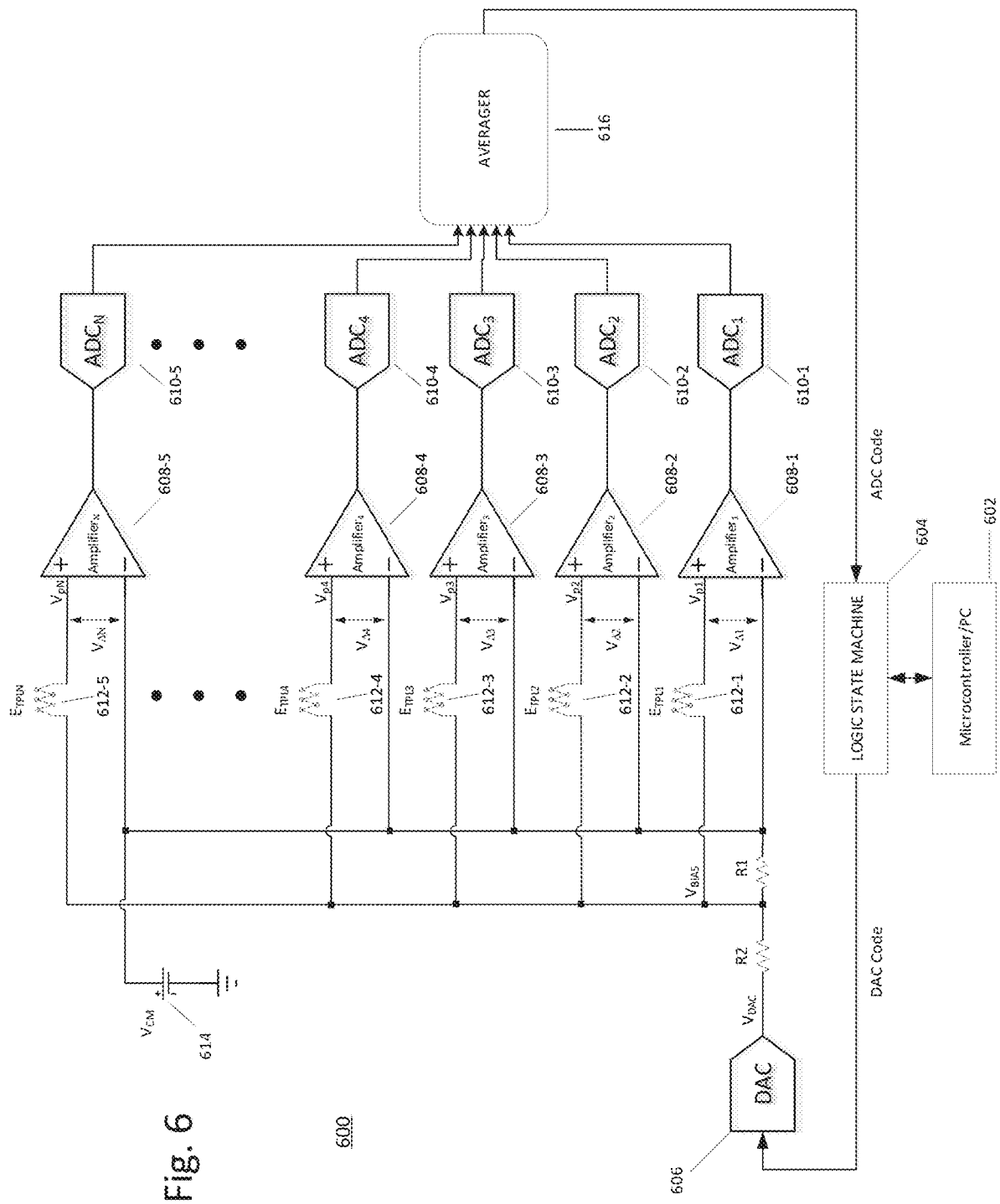
FIG. 6 is a circuit schematic illustrating a readout arrangement with an adjustable bias voltage applied to the cathodes of a plurality of thermopiles interfaced to a plurality of amplifiers/ADCs, according to an embodiment of the present invention.

In yet another embodiment, as shown in FIG. 6, a plurality of thermopile sensors 612-1 to 612-5, amplifiers 608-1 to 608-5 and ADCs 610-1 to 610-5 are included. In this embodiment, there may be a resistive divider driven by DAC 606 and CM source 614, both of which are combined to generate a $V_{BIAS}$ for the cathodes of thermopiles 612-1 to 612-5 to increase the sensitivity of all of the measurement channels. In this case, the important metric may be the differences between neighboring thermopile outputs or between any thermopile output and the average of the ensemble of thermopile outputs. The outputs of all of the ADCs 610-1 to 610-5 are digitally averaged by averager 616. Averager 616 may generate a code for DAC 606, which derives from the ensemble average of ADCs 610-1 to 610-5 in the first pass of the measurement sequence. After DAC 606 has settled, amplifier 610 gains are set to $G_F$. After amplifier 610 outputs have settled, the second pass measurement is made with ADCs 610-1 to 610-5 and their outputs are sent to the user.

It should be appreciated that logic state machine 604 and microcontroller/PC 602 may have similar functions to the logic state machine and microcontroller/PC described in FIGS. 1 and/or 2.

To summarize, unlike the methods described herein, the current state of the art requires (1) a higher supply voltage to prevent over-range or saturation of the amplifier(s) and or ADC(s) at high gains and/or (2) a higher resolution ADC. This may result in greater power dissipation, larger mass and volume due to needing a larger package/board to accommodate the higher voltage ASIC and/or circuit.

In multi-channel readouts for thermopile arrays, each channel could have its own ADC (to increase throughput). In those cases, increased ADC complexity may result in a relatively large increase in power dissipation and mass. In the current state of the art, the thermopile cathodes are often fixed at the CM level applied to the amplifier negative terminal(s). In some of the embodiments described herein, an adaptive bias scheme as opposed to the fixed bias schemes is utilized. The user may program the DAC to vary the bias voltage to the thermopiles based on initial measurements at a lower gain.

Some embodiments may be used to increase the measurement sensitivity of a thermopile sensor, or for a non-dispersive infrared (NDIR) sensor used in gas analysis for industry and medicine. It can also be used to improve the contrast/sensitivity of IR focal plane arrays (IR imagers) used for measuring glacier, terrain and atmospheric temperature gradients, or temperature measurement, etc.

Some embodiments include one or more DACs and a resistor divider are configured to generate a variable bias voltage $V_{BIAS}$ with respect to a CM voltage $V_{CM}$. The CM voltage $V_{CM}$ is applied to a cathode of one or more thermopiles or a negative input of one or more amplifiers to prevent saturation and over range of one or more low voltage readout amplifiers and one or more ADCs.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a digital-to-analog converters (DAC) configured to generate a variable voltage to drive a resistor divider; and
a thermopile comprising an anode and a cathode, wherein the variable voltage is applied to a cathode of the thermopile to prevent saturation and over range of a low voltage readout amplifier, analog-to-digital converter (ADC), or both.

2. The apparatus of claim 1, wherein the resistor divider formed by a first resistor and a second resistor,
the DAC with the resistor divider are configured to generate a variable bias voltage with respect to a common mode (CM) voltage $V_{CM}$.

3. The apparatus of claim 2, wherein the common mode voltage $V_{CM}$ is buffered by the amplifier.

4. The apparatus of claim 1, wherein the DAC is configured to generate a first voltage, the first voltage is applied to the first resistor.

5. The apparatus of claim 1, further comprising:
a voltage source configured to generate the common mode voltage $V_{CM}$, the common mode voltage is applied to the second resistor and the negative input terminal of the amplifier.

6. The apparatus of claim 1, further comprising:
an application circuit is configured to control a setting of the DAC.

7. The apparatus of claim 1, wherein a bias voltage $V_{BIAS}$ is applied to the cathode of the thermopile.

8. An apparatus, comprising;
one or more digital-to-analog converters (DACs) and a resistor divider are configured to generate a variable bias voltage $V_{BIAS}$ with respect to a common mode (CM) voltage $V_{CM}$, wherein
the CM voltage $V_{CM}$ is applied to a cathode of one or more thermopiles or a negative input of one or more amplifiers to prevent saturation and over range of one or more low voltage readout amplifiers and one or more analog-to-digital converters (ADCs).

9. The apparatus of claim 8, wherein the one or more DACs are configured to generate a variable voltage $V_{DAC}$ to drive the resistor divider.

10. The apparatus of claim 9, wherein the one or more DACs are configured to drive a first resistor, the first resistor is connected to a second resistor to form the resistor divider.

11. The apparatus of claim 10, wherein the second resistor is driven by another voltage source, the other voltage source comprises a fixed or adjustable value equal to zero or non-zero voltage with respect to a ground reference of the amplifier.

12. The apparatus of claim 11, wherein the second resistor is driven by the other voltage source generated by one or more additional DACs.

13. The apparatus of claim 8, wherein a junction formed by the one or more DACs and the resistor divider provides the variable bias voltage $V_{BIAS}$.

14. The apparatus of claim 13, wherein an optimum variable bias voltage $V_{BIAS}$ is applied to the negative input of the one or more amplifiers is set to approximate a value of a voltage at an anode of the one or more thermopiles with respect to the cathode of the one or more thermopiles.

15. The apparatus of claim 14, wherein the optimum variable bias voltage $V_{BIAS}$ is configured to drive an differential input of the one or more amplifiers closer to zero voltages, allowing a higher gain to be employed within the one or more amplifiers.

16. The apparatus of claim 13, wherein the optimum variable voltage bias $V_{BIAS}$ is selected to zero or null a value of a voltage at an anode of the one or more thermopiles with respect to the negative input of the one or more amplifiers.

17. The apparatus of claim 16, the optimum variable voltage bias $V_{BIAS}$ drives a differential input of the one or more amplifiers closer to zero volts, allowing higher gain to be employed within the one or more amplifiers.

18. An apparatus of claim 8, further comprising:
an adjustable logic configured to settings of the one or more DACs, wherein
the adjustable logic is configured to compute an input code Codes for the one or more DACs voltages.

19. An apparatus, comprising:
a digital-to-analog converter (DAC) configured to generate an adjust voltage bias $V_{BIAS}$ to diver a second resistor; and
a thermopile modeled as a voltage source, comprising an anode connecting to a positive input terminal of an amplifier, wherein
the amplifier comprising a negative input driven from a junction of a first resistor and a second resistor, together which form a resistor divider.

20. The apparatus of claim 19, wherein the DAC with the resistor divider is configured to generate a common mode voltage applied to a cathode of the thermopile.

* * * * *